US009396562B2

(12) United States Patent
Lefebvre et al.

(10) Patent No.: US 9,396,562 B2
(45) Date of Patent: *Jul. 19, 2016

(54) MRI RECONSTRUCTION WITH INCOHERENT SAMPLING AND REDUNDANT HAAR WAVELETS

(71) Applicant: Siemens Aktiengesellschaft, Munich (DE)

(72) Inventors: Alban Lefebvre, Jersey City, NJ (US); Jun Liu, Cary, NC (US); Edgar Mueller, Heroldsbach (DE); Mariappan S. Nadar, Plainsboro, NJ (US); Michaela Schmidt, Uttenreuth (DE); Michael Zenge, Nuremberg (DE); Qiu Wang, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/036,352

(22) Filed: Sep. 25, 2013

(65) Prior Publication Data

US 2014/0086469 A1 Mar. 27, 2014

Related U.S. Application Data

(60) Provisional application No. 61/705,799, filed on Sep. 26, 2012, provisional application No. 61/705,805, filed on Sep. 26, 2012.

(51) Int. Cl.
*G06T 11/00* (2006.01)
*G01R 33/48* (2006.01)
(Continued)

(52) U.S. Cl.
CPC .......... *G06T 11/005* (2013.01); *G01R 33/5611* (2013.01); *G01R 33/482* (2013.01);
(Continued)

(58) Field of Classification Search
CPC ..................... G01R 33/56308; G01R 33/4818; G06T 11/003; G06T 2207/20064
See application file for complete search history.

(56) References Cited

U.S. PATENT DOCUMENTS

| 2009/0262996 | A1 | 10/2009 | Block | |
| 2011/0293193 | A1* | 12/2011 | Garg | ..................... G06T 11/006 382/203 |
| 2014/0126796 | A1* | 5/2014 | Chesneau et al. | ............. 382/131 |

FOREIGN PATENT DOCUMENTS

WO 2012028955 A2 3/2012

OTHER PUBLICATIONS

PCT International Search Report mailed Mar. 3, 2014 corresponding to PCT International Application No. PCT/US2013/061824 filed Sep. 26, 2013 (15 pages).

(Continued)

*Primary Examiner* — Vu Le
*Assistant Examiner* — Kenny Cese
(74) *Attorney, Agent, or Firm* — Peter Kendall

(57) ABSTRACT

A method of image reconstruction for a magnetic resonance imaging (MRI) system having a plurality of coils includes obtaining k-space scan data captured by the MRI system, the k-space scan data being representative of an undersampled region over time, determining a respective coil sensitivity profile for the region for each coil of the plurality of coils, and iteratively reconstructing dynamic images for the region from the k-space scan data via an optimization of a minimization problem. The minimization problem is based on the determined coil sensitivity profiles and redundant Haar wavelet transforms of the dynamic images.

20 Claims, 5 Drawing Sheets

(51) Int. Cl.
G01R 33/56 (2006.01)
G01R 33/561 (2006.01)
G01R 33/563 (2006.01)

(52) U.S. Cl.
CPC ......... G01R33/4824 (2013.01); G01R 33/5608 (2013.01); G01R 33/5635 (2013.01); G01R 33/56308 (2013.01)

(56) References Cited

OTHER PUBLICATIONS

Lui, Jun, et al; "Dynamic Cardiac MRI Reconstruction with Weighted Redundant Haar wavelets," Proceedings of the International Society for Magnetic Resonance in Medicine, 20th Annual Meeting and Exhibition, Melbourne, Australia; vol. 20, p. 4249, XP055102780; AU; Apr. 21, 2012.

Liu, Jun, et al; "Regularized Reconstruction Using Redundant Haar Wavelets: A means to achieve high under-sampling factors in non-contrast-enhanced 4D MRA," Proceedings of the International Society for Magnetic Resonance in Medicine, 20th Annual Meeting and Exhibition, Melbourne, Australia, May 5-11, 2012, vol. 20, p. 2237, XP055102787; AU; Apr. 21, 2012.

Lai, P., et al; "Efficient L1SPIRiT Reconstruction (ESPIRiT) for Highly Accelerated 3D Volumetric MRI with Parallel Imaging and Compressed Sensing," Proceedings of the International Society for Magnetic Resonance in Medicine, 18th Scientific Meeting and Exhibition, Stockholm, Sweden, vol. 18, p. 345, XP055103132; SE; Apr. 17, 2010.

Gamper, U., et al; "Compressed Sensing in Dynamic MRI," Magnetic Resonance in Medicine, Academic Press, Duluth, MN, US, vol. 59, No. 2; pp. 365-373, XP007909390; US; Feb. 1, 2008.

A. Beck et al., "A Fast Iterative Shrinkage—Thresholding Algorithm for Linear Inverse Problems," SIAM J. Imaging Sciences, vol. 2, No. 1, pp. 183-202, 2009.

R. L. Dykstra, "An Algorithm for Restricted Least Squares Regression," Journal of the American Statistical Association, vol. 78, Issue 384, pp. 837-842, Dec. 1983.

J. A. Fessler et al., "Nonuniform Fast Fourier Transforms Using Min-Max Interpolation," IEEE Transactions on Signal Processing, vol. 51, No. 2, pp. 560-574, Feb. 2003.

M. Lustig et al., "L1 SPIR-iT: Autocalibrating Parallel Imaging Compressed Sensing," Proc. Intl. Soc. Mag. Reson. Med, vol. 17, p. 379, 2009.

M. Lustig et al., "An Eigen-Vector Approach to AutoCalibrating Parallel MRI, Where SENSE Meets GRAPPA," Proc. Intl. Soc. Mag. Reson. Med, vol. 19, p. 479, 2011.

K. P. Pruessmann et al., "SENSE: Sensitivity Encoding for Fast MRI," Magnetic Resonance in Medicine, vol. 42, pp. 952-962, 1999.

V. Rasche et al., "Continuous Radial Data Acquisition for Dynamic MRI," MRM, vol. 34, pp. 754-761, 1995.

D. O. Walsh et al., "Adaptive Reconstruction and Enhancement of Phased Array MR Imagery," Magnetic Resonance in Medicine, pp. 1-23, 2000.

J. Xie et al., "Cardiac magnetic resonance imaging using radial k-space sampling and self-calibrated partial parallel reconstruction," Magnetic Resonance Imaging, vol. 28, pp. 495-506, 2010.

* cited by examiner

MRI RECONSTRUCTION WITH INCOHERENT SAMPLING AND REDUNDANT HAAR WAVELETS

CROSS-REFERENCES TO RELATED APPLICATIONS

This application claims the benefit of U.S. provisional application entitled "Sparse Learning in Parallel Magnetic Resonance Imaging," filed Sep. 26, 2012, and assigned Ser. No. 61/705,799, and U.S. provisional application entitled "Cardiac MRI Reconstruction with Incoherent Sampling and Weighted Redundant Haar Wavelets," filed Sep. 26, 2012, and assigned Ser. No. 61/705,805, the entire disclosures of which are hereby expressly incorporated by reference.

FIELD

The disclosure relates generally to magnetic resonance imaging (MRI) systems and, more particularly, to parallel transmission MRI systems.

BACKGROUND

Magnetic resonance imaging (MRI) is a medical imaging technique in widespread use for viewing the structure and/or function of the human body. MRI systems provide soft-tissue contrast, such as for diagnosing many soft-tissue disorders. MRI systems generally implement a two-phase method. The first phase is the excitation phase, in which a magnetic resonance signal is created in the subject with a main, polarizing magnetic field, $B_0$, and a radio frequency (RF) excitation pulse, $B_1^+$. The second phase is the acquisition phase, in which the system receives an electromagnetic signal emitted as the excited nuclei relax back into alignment with the main magnetic field after the excitation pulse $B_1$ is terminated. These two phases are repeated pair-wise to acquire enough data to construct an image.

Higher magnetic field strength scanners have been recently used to improve image signal-to-noise ratio and contrast. However, a spatial variation in the magnitude of the RF excitation magnetic field, $B_1^+$, occurs with main magnetic field strengths of, for example, 7 Tesla. This undesirable non-uniformity in the excitation across the region of interest is commonly referred to as "center brightening," "$B_1^+$ inhomogeneity" or "flip angle inhomogeneity."

Newer-generation MRI systems have generated RF pulses with a spatially tailored excitation pattern to mitigate $B_1^+$ inhomogeneity by exciting a spatial inverse of the inhomogeneity. In these systems, multiple radio-frequency pulse trains are transmitted in parallel over independent radio-frequency transmit channels, e.g., the individual rods of a whole-body antenna. This method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes.

Parallel transmission has also been used to reduce acquisition times. The variation in sensitivities between individual coils in the array is exploited to reduce the number of gradient encodings involved in an imaging procedure.

Reduced acquisition times and other advances have enabled dynamic MRI procedures directed to studying the motion of an object. For example, dynamic MRI imaging has been used for cine imaging of the heart. The reduced acquisition times have maintained image quality despite the reduced number of gradient encodings.

The temporal resolution of dynamic imaging can nonetheless benefit from further decreases in acquisition time. A compromise is often made between spatial resolution and temporal resolution. Undersampling techniques are usually implemented to achieve further savings in acquisition time. For example, scan data may be acquired for every other line to cut the acquisition time in half.

SUMMARY

Image reconstruction in a magnetic resonance imaging (MRI) system is implemented on undersampled or incoherently sampled scan data with an iterative procedure in which a minimization problem is optimized. The minimization problem is based on coil sensitivity profiles and redundant Haar wavelet transforms.

In accordance with one aspect, a method of image reconstruction for an MRI system including a plurality of coils includes obtaining k-space scan data captured by the MRI system, the k-space scan data being representative of an undersampled region over time, determining, with a processor, a respective coil sensitivity profile for the region for each coil of the plurality of coils, and iteratively reconstructing, with the processor, dynamic images for the region from the k-space scan data via an optimization of a minimization problem. The minimization problem is a function of the determined coil sensitivity profiles and redundant Haar wavelet transforms of the dynamic images.

In accordance with another aspect, a computer program product is useful for implementing a method of image reconstruction for an MRI system including a plurality of coils. The computer program product includes one or more computer-readable storage media having stored thereon computer-executable instructions that, when executed by one or more processors of a computing system, cause the computing system to perform the method. The method includes obtaining k-space scan data captured by the MRI system, the k-space scan data being representative of an undersampled region over time, estimating a respective coil sensitivity profile for the undersampled region for each coil of the plurality of coils, and iteratively reconstructing dynamic images for the undersampled region from the k-space scan data via an optimization of a minimization problem. The minimization problem includes a first term based on a Fourier transform of the dynamic images of the undersampled region and the estimated coil sensitivity profiles and further includes a second term including weighted redundant Haar wavelet transforms of the dynamic images.

In accordance with yet another aspect, a data processing system is useful for an MRI system including a plurality of coils. The data processing system includes a memory in which coil sensitivity estimation instructions and iterative reconstruction instructions are stored, a data store in which k-space scan data captured by the MRI system is stored, the k-space scan data being representative of an undersampled region over time, and a processor coupled to the memory and the data store, and configured to execute the coil sensitivity estimation instructions to estimate a respective coil sensitivity profile for the undersampled region for each coil of the plurality of coils. The processor is further configured to execute the iterative reconstruction instructions to reconstruct dynamic images for the undersampled region from the k-space scan data via an optimization of a minimization problem. The minimization problem includes a first term based on a Fourier transform of the dynamic images of the undersampled region and the estimated coil sensitivity profiles and further includes a second term comprising weighted redundant Haar wavelet transforms of the dynamic images.

DETAILED DESCRIPTION OF THE DRAWINGS

Figure 1:
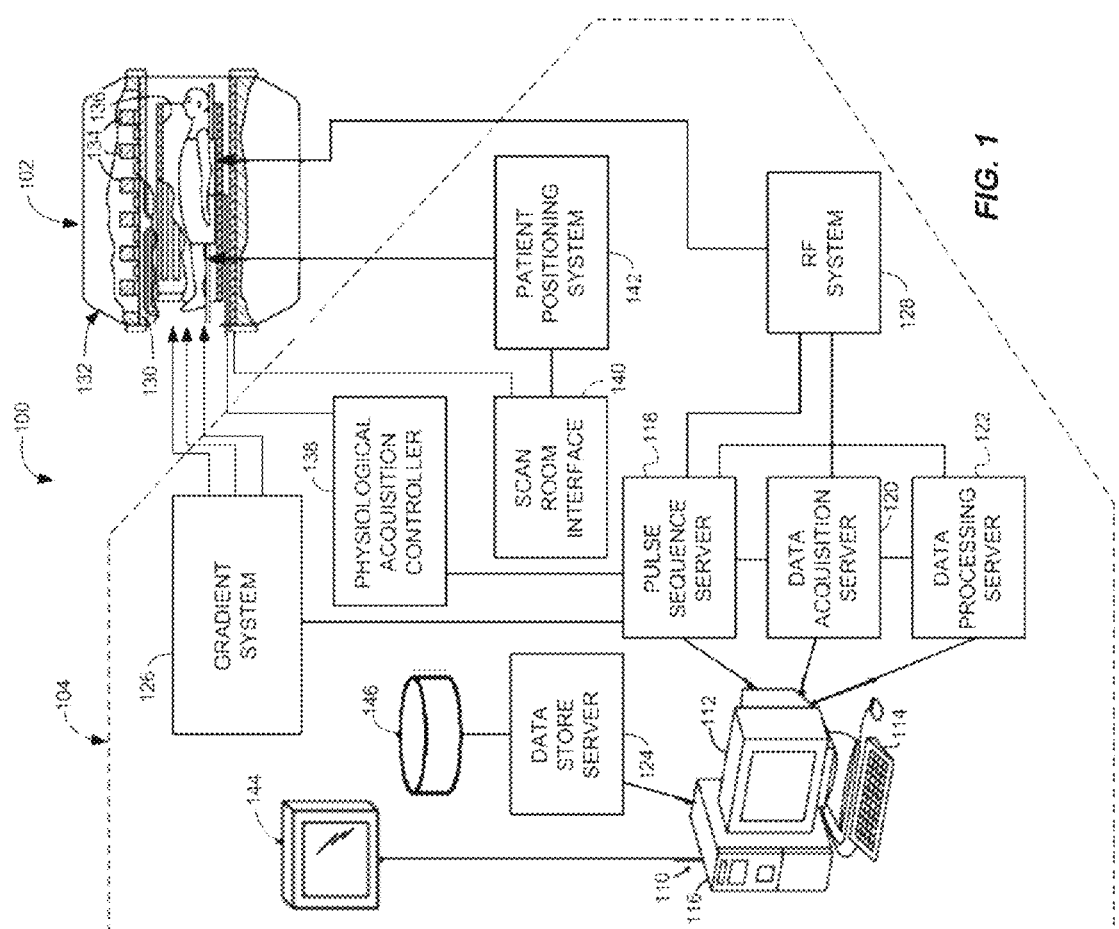
FIG. 1 is a block diagram of one embodiment of a magnetic resonance imaging (MRI) system.

Image reconstruction techniques in cine or dynamic magnetic resonance imaging (MRI) systems are described. The reconstruction techniques include an iterative procedure that uses redundant Haar wavelet transforms to take advantage of spatial and temporal correlations in and among the images to compensate for undersampling during the MRI scan procedure. The redundant Haar wavelet transforms may be weighted to emphasize the temporal correlations during iterative reconstruction.

The iterative reconstruction technique of the disclosed embodiments incorporates prior knowledge of the target image into a minimization problem to be optimized. The target image has known characteristics, the recognition of which may be used to reconstruct the image from undersampled scan data. The known characteristics of the target image are represented by the sparsity of the Haar wavelet transforms of the target image. The Haar wavelet transforms of the target image are sparse in the sense that the gradient images computed by the transforms include a lot of pixels with a value of zero. For example, a Haar wavelet transform directed to a vertical gradient generates a lot of zero-value pixels if many of the adjacent pixels in the vertical direction have the same value. The minimization problem to be solved or optimized is configured to incorporate prior knowledge of such sparsity.

The disclosed embodiments are configured to reconstruct dynamic images while making use of incoherent sampling. The incoherent sampling involves undersampling the k-space, as described below, to reduce acquisition times and improve temporal resolution. In real-time imaging, there is insufficient time to acquire more than a few gradient encodings. The incoherent sampling is configured to provide a suitable sampling pattern. The disclosed embodiments may use a variety of different sampling patterns, including Cartesian and radial sampling patterns. During reconstruction, a Fourier transform in accordance with the sampling pattern may be used on the undersampled dynamic images.

The MRI systems of the disclosed embodiments are configured for parallel imaging with multiple coils. Parallel imaging exploits the difference in sensitivities between individual coil elements in a receive array to reduce the number of gradient encodings. The disclosed embodiments use the different coil sensitivities for image reconstruction despite the undersampled k-space scan data.

The disclosed embodiments estimate or otherwise determine the coil sensitivity profile of each coil. The coil sensitivity profiles may be determined based on a pre-scan or other reference scan of a region to be imaged. Alternatively or additionally, the coil sensitivity profiles may be determined based on the scan used to generate data for image reconstruction. In some cases, an eigenvector-based approach may be used to estimate the coil sensitivities. Other approaches may be used, including, for instance, a sum-of-the-squares technique, as described below.

Although described in connection with cine cardiac imaging, the disclosed embodiments may be used for reconstructing images of a variety of different objects. For example, the disclosed embodiments may be used in connection with reconstructing images of blood flow outside of the heart. The disclosed embodiments are not limited to cardiac magnetic resonance (CMR) imaging or MRI procedures in which contrast agent is used. Other cine or dynamic MRI imaging, whether now known or hereafter developed, may incorporate the disclosed embodiments.

Turning now to the drawing figures, FIG. 1 depicts a magnetic resonance imaging ("MRI") system 100 configured in accordance with several aspects of the disclosure. The MRI system 100 generally includes a scanner or data acquisition unit 102 and a control system 104 for directing the operation of the scanner 102. In an excitation phase of operation, the data acquisition unit 102 creates a magnetic resonance signal by subjecting a subject to a main magnetic field, B0, to align the individual magnetic moments, or spins, of the nuclei in the tissue with the axis of the polarizing field (conventionally, the z-axis). The main magnetic field also causes the magnetic moments to resonantly precess about the axis at their characteristic Larmor frequency. The data acquisition unit 102 then subjects the tissue to a radio frequency (RF) excitation pulse, B1, with a frequency near the Larmor frequency, so that a magnetic field in the x-y plane re-orients, flips, or tips the net aligned moment, Mz, into or toward the x-y plane, producing a net transverse magnetic moment Mxy, the so-called spin magnetization. The excitation phase is generally tailored to localize the excitation pulse to a specific region within the subject, such as a 3D slab or a relatively thin 2D slice. In a subsequent acquisition phase of operation, the data acquisition unit 102 encodes the localized region in all three dimensions for a 3D slab or only in-plane for a thin slice. The region to be imaged may be scanned by a sequence of measurement cycles in which magnetic field gradients ($G_x$, $G_y$, and $G_z$) vary according to the particular localization method being used. Tailored RF pulses may be used to localize the excitations.

The control system 104 includes a workstation 110 having one or more output interfaces (e.g., display) 112 and one or more input interfaces (e.g., keyboard) 114. The workstation 110 includes a processor 116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers, including, in this example, a pulse sequence server 118, a data acquisition server 120, a data processing server 122, and a data store server 124. The workstation 110 and the servers 118, 120, 122 and 124 may communicate with each other via any desired communication technique, protocol, or standard. The servers 118, 120, 122, and 124 may correspond with respective services provided by a single workstation, such as the workstation 110. The components of the control system 104 may be coupled to one another via a data bus or network (not shown) and need not be connected via respective, dedicated communication lines as shown. Any one or more of the components of the control system 104 may be implemented as a service unit, module, or other unit implemented by a common physical machine or other device, such as the workstation 110. Additional, different, or fewer components may be provided, such as combining two or more servers or providing the workstation functionality on a server or vice versa.

The pulse sequence server 118 functions in response to instructions downloaded from the workstation 110 to operate a gradient system 126 and a radio frequency ("RF") system 128. Scan sequences containing data indicative of the RF pulses and gradients may be stored in a library or other memory of the pulse sequence server 118 or other component of the control system 104. Gradient waveforms to perform the prescribed scan are produced and applied to the gradient system 126 that excites gradient coils in a gradient coil assembly 130 to produce the magnetic field gradients $G_x$, $G_y$, and $G_z$ used for position-encoding MR signals. The gradient coil assembly 130 forms part of a magnet assembly 132 that includes an annular or other polarizing magnet 134 and a whole-body RF coil array 136. In some cases, the whole-body RF coil array 136 is constructed in the form of a so-called birdcage antenna and has a number of individual antenna rods which run parallel to the patient tunnel and are uniformly distributed in a circumferential arrangement around the patient tunnel. The individual antenna rods may be capacitively coupled to one another in a ring shape at one end of the birdcage antenna. Other antenna or coil configurations may be used.

RF excitation waveforms are applied to the RF coil 136 by the RF system 128 to perform a selected magnetic resonance pulse sequence. Responsive MR signals detected by the RF coil array 136 or a separate local coil array (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil 136 or to one or more local coils or coil arrays. As described below, the RF transmitter includes a plurality of transmission channels to produce RF pulses formed via the superimposition of the RF pulses generated by each transmission channel.

The RF system 128 also includes a plurality of RF receiver channels. Each RF receiver channel includes an RF amplifier that amplifies the MR signal received by the coil to which it is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals are typically used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 passes the acquired MR data to the data processor server 122. However, in scans that require information derived from acquired MR data to control the further performance of the scan, the data acquisition server 120 may also be programmed to produce such information and convey it to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices. Also, navigator signals may be acquired during a scan and used to adjust RF or gradient system operating parameters or to control the view order in which the k-space is sampled. The data acquisition server 120 may be employed to process MR signals used to detect the arrival of contrast agent in a magnetic resonance angiography (MRA) scan. In all these examples, the data acquisition server 120 acquires MR data and processes it in real-time to produce information that is used to control the scan.

The data processing server 122 receives raw k-space MR scan data from the data acquisition server 120 and processes it in accordance with instructions downloaded from the workstation 110. The raw data acquired by an MR scanner are the Fourier coefficients of the image, or the so-called k-space data. The k-space data is typically acquired by a series of phase or frequency encodings. Each phase encoding covers a given amount of k-space data, which is related to the trajectory and sampling of the scan. The k-space reflects the sampling pattern, e.g., Cartesian sampling, radial sampling, etc. of the scan. For example, with Cartesian sampling, a total of 256 frequency encodings are used to generate the full k-space of one 256×256 pixel image. The k-space may be under-sampled in the disclosed embodiments as described herein.

The processing of the k-space scan data may include processing of reference scan data for calibration of an iterative reconstruction procedure, as well as image reconstruction of scan data via the reconstruction procedure. Further details regarding such calibration and image reconstruction are provided below in connection with FIGS. 3 and 4. In some cases, the processing may include further data processing involving, for example, Fourier transformation of raw k-space MR data, the application of filters to a reconstructed image, the performance of back-projection image reconstruction of acquired MR data, the calculation of functional MR images, the calculation of motion or flow images, segmentation, rendering, or other visualization processes.

Images reconstructed by the data processing server 122 are conveyed back to the workstation 110 for storage and/or display. Real-time images may be stored in a database memory cache (not shown) from which they may be output to the display 112 or an auxiliary terminal or console 144, which may be located near the magnet assembly 132 for use by attending radiologists or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
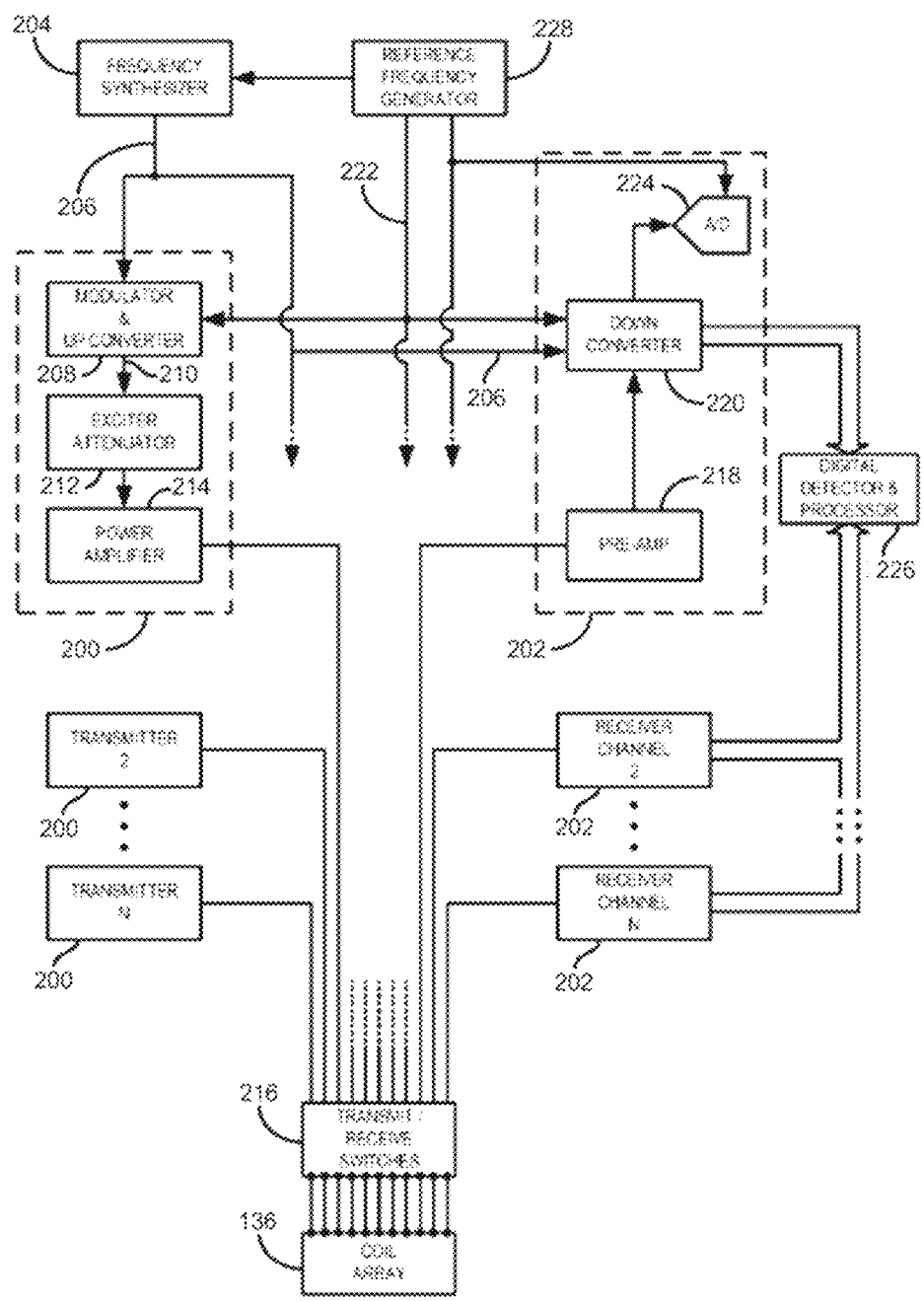
FIG. 2 is a block diagram of an RF system and other components of the MRI system of FIG. 1 to depict a parallel transmission architecture of the RF system in accordance with one embodiment.

Referring now to FIG. 2, the RF system 128 and other components of the system 100 are shown in greater detail. The whole body coil array 136 generally includes a plurality of coils or coil elements that can be separately driven by a plurality of RF transmitters 200 to produce a desired RF field-of-excitation ("FOX"). Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to acquire the MR signals. A variety of different coil array structures may be used as part of the system 100 (FIG. 1).

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where its amplitude is modulated in response to a signal also received from the pulse sequence server 118. The signal defines the envelope of the RF excitation pulse to be produced and is generated by sequentially reading out a series of stored digital values. These stored digital values may be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers 214 are current source devices that connect to respective transmit inputs on a set of transmit/receive switches 216. In this example, a desired number N of the transmitters 200 are employed and connected through a corresponding number N of the transmit/receive switches 216 to a corresponding number N of the coil elements in the RF coil array 136. Other transmit/receive arrangements may be used.

The signal produced by the subject is picked up by the coil array 200 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the nuclear magnetic resonance (NMR) signal with the carrier signal on the line 206, and then mixes the resulting difference signal with a reference signal on a line 222. The down converted NMR signal is applied to the input of an analog-to-digital ("A/D") converter 224 which samples and digitizes the analog signal and applies the digital signal to a digital detector and signal processor 226. The digital detector and signal processor 226 produces 16-bit in-phase (I) values and 16-bit quadrature (Q) values corresponding to the received signal, but other formats may be used. The resulting stream of digitized I and Q values of the received signal are output to the data acquisition server 120 (FIG. 1). The reference signal as well as the sampling signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure.

When the $B_1$ field is not produced, the pulse sequence server 118 directs the transmit/receive switches 216 to connect each of the N receive channels to the respective N coil elements. Signals produced by the excited spins in the subject are picked up and separately processed as described above.

Figure 3:
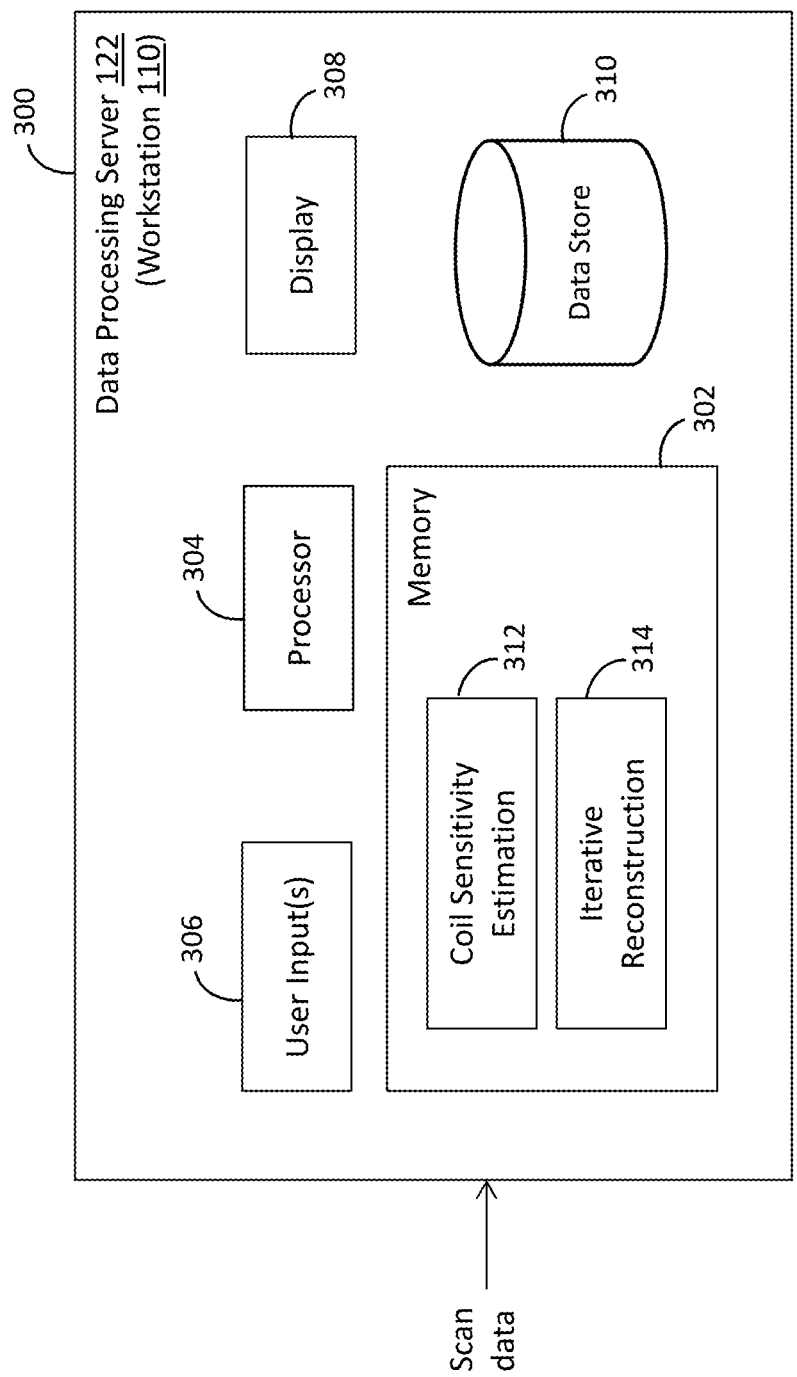
FIG. 3 is a block diagram of a data processing system, such as the data processing server and/or workstation of the MRI system of FIG. 1, in accordance with one embodiment.

FIG. 3 depicts a data processing system 300 for an MRI system, such as the parallel imaging MRI systems having multiple coils as described above in connection with FIGS. 1 and 2. The data processing system 300 may correspond with the data processing server 122 (FIG. 1), the workstation 110 (FIG. 1), or any combination thereof. The data processing system 300 may be integrated or correspond with any of the components described in connection with FIG. 1. In this example, the data processing system 300 includes a memory 302, a processor 304, user input(s) 306, a display 308, and a data store 310. The processor 304 is coupled to the memory 302 and the data store 310 to execute computer-executable instructions stored in the memory 302 to process scan data stored in the data store 310 to reconstruct images from the scan data. The reconstructed images may be rendered on the display 308. The user input(s) 306 may be used to provide manual instructions to the data processing system 300. The data processing system 300 may include fewer, additional, or alternative components. For example, the data processing system 300 may be configured as a server, such as the data processing server 122, in which the user input(s) 306 and the display 308 are not included.

K-space scan data is obtained by the data processing system 300 for a region over time, such as a two-dimensional slice or a three-dimensional slab or other volume. The scan data may be received during a scan sequence, as described above. The scan sequence may be a pre-scan or reference scan sequence, or a scan sequence configured to generate undersampled scan data for image reconstruction. The scan data may then be stored in the data store 310. Alternatively, the scan data may be previously captured or acquired by the MRI system and obtained from the data store 310 and/or a different data store. Either way, the k-space scan data is thereafter accessible from the data store 310 for use in calibration of the reconstruction procedure and/or for image reconstruction.

The k-space scan data for image reconstruction is representative of an undersampled region over time. The undersampling may be in accordance with a variety of sampling patterns. In some embodiments, the undersampling may include or be in accordance with a Cartesian sampling pattern. Each row of the Cartesian sampling pattern may correspond with a respective frequency encoding. The Cartesian sampling pattern may then undersample the k-space by periodically skipping every other line, or periodically skipping multiple lines. Time interleaving of k-space lines in sequential images may also be implemented. Non-Cartesian sampling patterns may be used, including, for instance, spiral, projection, and other radial sampling patterns.

In embodiments in which reference scan data is obtained for the region, the reference scan data is not undersampled. But, in some cases, to save time, the reference scan data may be of the same or lower quality than the scan data for image reconstruction. For example, the reference scan data may be limited to a low frequency or central portion of the k-space.

The memory 302 is a computer-readable storage medium in which computer-executable instructions or instruction sets are stored for execution by the processor 304 to implement the image reconstruction procedure of the disclosed embodiments. In the embodiment of FIG. 3, the instructions are arranged in coil sensitivity estimation instructions 312 and iterative reconstruction instructions 314. The instructions 312, 314 may be configured as discrete modules or instruction sets. The instructions 312, 314 may be integrated to any desired extent. Additional or alternative instruction sets or modules may be stored in the memory 302. For example, the instructions relating to the iterative reconstruction procedure may be divided into a number of modules rather than being integrated into a single module as shown. Another module or instruction set may be stored on the memory 302 for obtaining the k-space scan data for storage in, or access from, the data store 310.

The coil sensitivity estimation instructions 312 are configured to cause the processor 304 to estimate or otherwise determine a respective coil sensitivity profile for each coil in the MRI system. The coil sensitivity profiles are determined for the region for which images are to be reconstructed. The coil sensitivity profiles may be determined based on reference scan data for the region and/or based on the scan data acquired via the incoherent sampling pattern used for producing data for the image reconstruction. The instructions 312 may be configured to cause the processor 304 to implement various techniques for estimating or determining the coil sensitivity profiles, including, for example, an eigenvector-based approach or a sum of the squares approach. The eigenvector-based approach may estimate each coil sensitivity profile using a singular value decomposition (SVD)-based eigenvector technique, which may use average k-space data across all of the temporal phases in the scan data. In those cases, the coil sensitivity is estimated independently at each of the pixel locations. A calibration matrix is assembled from the k-space calibration data. A row-space matrix is computed based on the calibration matrix. The row-space matrix is then transformed to the image domain with a matrix for each pixel location. The final estimated coil sensitivity at each pixel location is the eigenvector that corresponds to the highest eigenvalue of such image domain matrices. Further details regarding examples of coil sensitivity profile estimation procedures that may be implemented via the instructions 312 are provided in Lustig et al., "An Eigen-Vector Approach to Auto-Calibrating Parallel MRI, Where SENSE Meets GRAPPA," Proc. Intl. Soc. Mag. Reson. Med., Vol. 19, p. 479 (2011), and Pruessmann et al., "SENSE: Sensitivity Encoding for Fast MRI," Magnetic Resonance in Medicine, Vol. 42, pp. 952-962 (1999), the entire disclosures of which are hereby incorporated by reference.

The iterative reconstruction instructions 314 are configured to cause the processor 304 to implement an iterative image reconstruction procedure to reconstruct dynamic images for the undersampled region from the k-space scan data. The image reconstruction procedure includes an optimization of a minimization problem based on the coil sensitivity profiles and redundant Haar wavelet transforms of the dynamic images.

The minimization problem presents an objective function having a data fidelity term based on a Fourier transform of the undersampled dynamic images and the estimated coil sensitivity profiles. The Fourier transform may be modified in accordance with an undersampling operator configured in accordance with a sampling pattern of the k-space scan data. In one example, the data fidelity term is configured in accordance with an $L_2$ norm. Other norms may be used, including, for example, the Frobenius norm.

The objective function includes a prior knowledge term based on or constituting weighted redundant Haar wavelet transforms of the dynamic images. The prior knowledge term may be representative of temporal and/or spatial correlation and, thus, structure in the target images. The prior knowledge presented by the term may relate to the redundant Haar wavelet transforms being sparse. The wavelet coefficients resulting from application of the redundant Haar wavelet transform to the target image are compressible due to the temporal and/or spatial correlations.

The application of the Haar wavelet transform to the target image generates four outputs. The first output is representative of the average of the pixel values in all directions. The second and third outputs are the gradients in the vertical and horizontal directions. The fourth output is representative of the gradient in both the vertical and horizontal directions.

The two terms of the minimization problem are summed. The relative contribution of the two terms may be weighted. In one embodiment, the prior knowledge term is weighted by a factor (see $\lambda$ below). In other embodiments, a factor may be applied to the other or both terms.

In one embodiment, the dynamic images are reconstructed by optimizing a minimization problem that may be expressed as follows:

$$\Sigma_i \Sigma_j \tfrac{1}{2} \lVert D_i F(s^j \odot x_i) - y_i^j \rVert_2^2 + \lambda \lVert d \odot (Wx) \rVert_1$$

where the indices i and j specify the row and the coil, respectively, $D_i$ is an undersampling operator to configure the 2D (or 3D) Fourier transform F, $y^j_i$ is the k-space scan data acquired by the j-th coil, $s^j$ is the coil sensitivity profile for the j-th coil, d is a weight operator to emphasize (e.g., place high weights on) temporal correlations in the redundant Haar wavelet transform coefficients resulting from the application of the redundant Haar wavelet transform W to the target image x. The component-wise multiplication operator is represented by the $\odot$ symbol. Other operators and/or functions may be used. The minimization problem is optimized to determine the target, or reconstructed, image x that minimizes the summation.

The iterative reconstruction instructions 314 may be configured to implement a variety of different optimization algorithms to solve the minimization problem. In one embodiment, the sub-band iterative shrinkage thresholding algorithm (S-ISTA) may be used. Other iterative shrinkage thresholding algorithms (ISTAs), such as a fast ISTA (FISTA), or other Nesterov-type approaches may be used. The minimization problem may also be solved using alternating direction method of multipliers (ADMM) techniques. The proximal operator associated with the non-smooth regularization term (with a redundant Haar transform as the sparsifying transform) may be efficiently solved using a Dykstra-type algorithm.

The processor 304 may be a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for determining position and/or generating images. The processor 304 is a single device or multiple devices operating in serial, parallel, or separately. The processor 304 may have any number of processing cores distributed over one or more devices. For example, the disclosed procedures may be implemented by a pair of central processing units (CPUs) having a total of four processing cores. The processor 304 may be a main processor of a computer, such as a laptop or desktop computer, or may be a processor for handling some tasks in a larger system, such as in an imaging system.

The memory 302 may be a graphics processing memory, video random access memory, random access memory, system memory, cache memory, hard drive, optical media, magnetic media, flash drive, buffer, database, combinations thereof, or other now known or later developed memory device for storing data or imaging information. The memory 302 is part of an imaging system, part of a computer associated with the processor 304, part of a database, part of another system, or a standalone device.

The memory 302 may include a non-transitory computer readable storage medium storing data representing instructions executable by the programmed processor 304. The instructions for implementing the processes, methods and/or techniques discussed herein are provided on computer-readable storage media or memories, such as a cache, buffer, RAM, removable media, hard drive or other computer readable storage media. Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, and parallel processing, as described above. Computer-readable storage media do not include communication media for carrying waves or signals.

Additional, fewer, or different components may be provided in the data processing system 300. For example, a network or network connection may be provided, such as for networking with a medical imaging network or data archival system. Any number or type of user inputs or other user interfaces may be provided.

Figure 4:
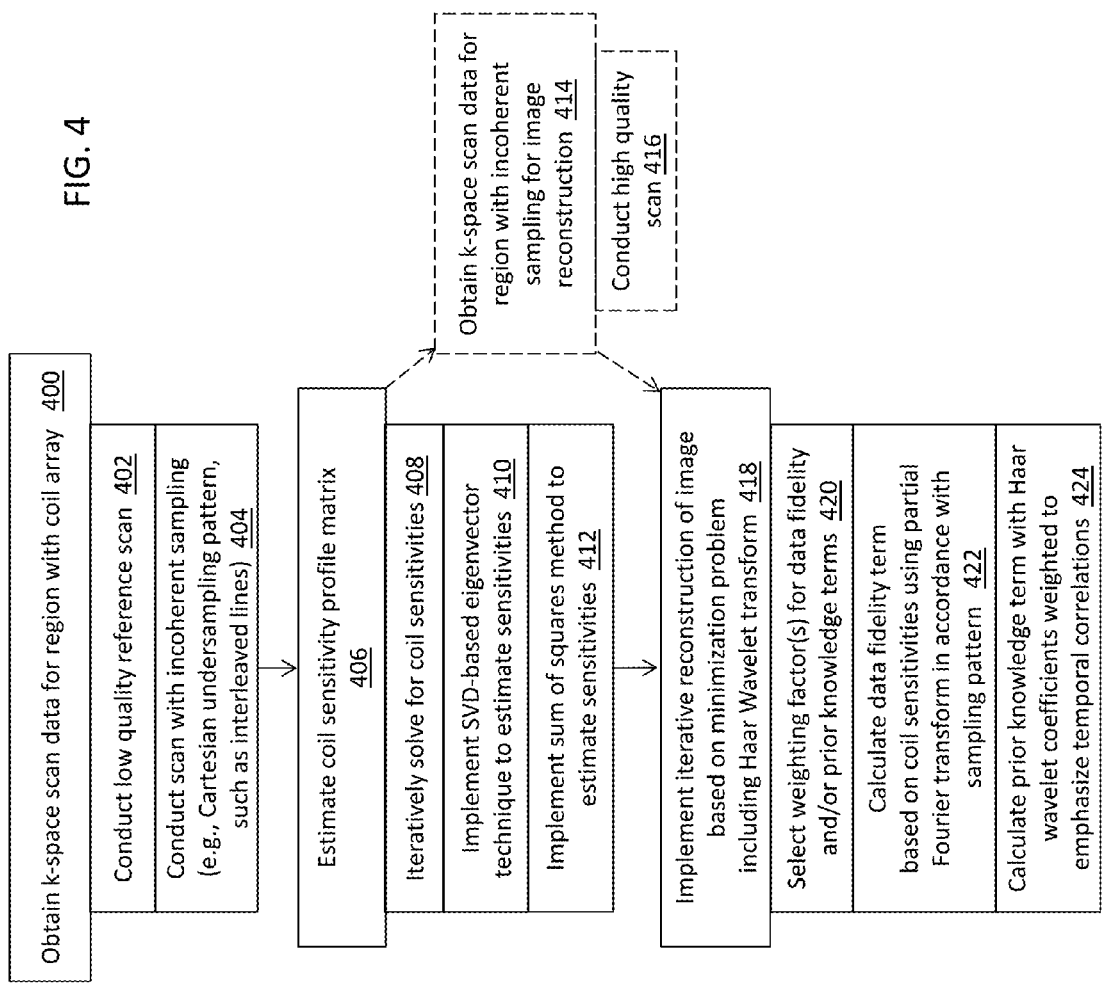
FIG. 4 is a flow diagram of one embodiment of a parallel transmission MRI method implemented by the data processing server or workstation of FIG. 3, and/or another component of the MRI system of FIG. 1.

FIG. 4 depicts a method of image reconstruction for an MRI system having multiple coils. The MRI system may be configured as described above in connection with FIGS. 1 and 2. The method may be used with other MRI systems. The method includes a sequence of acts that may be performed using the processor 304 and the data processing system 300 described above in connection with FIG. 3. Other processors and processing systems may be used. Additional, fewer, or alternative acts may be included in the method. For example, the scan data used for calibration or reconstruction may be obtained by accessing a data store, such as the data store 310 (FIG. 3).

The method may begin in an act 400 in which k-space scan data captured by the MRI system is obtained for a region with a coil array. The k-space scan data may be representative of an undersampled region over time. In other cases, the k-space scan data is obtained by conducting a low quality reference scan in an act 402. The reference scan data is obtained to calibrate the reconstruction procedure to process further scan data subsequently obtained. In either case, the scan data obtained in the act 400 is used to determine the coil sensitivity profile of each coil.

In cases where the scan data obtained in the act 400 is used for image reconstruction, the act 400 may include conducting a scan in an act 404 with incoherent sampling. The incoherent sampling may include or involve a variety of different sampling patterns. In one example, the undersampling is configured in accordance with a Cartesian sampling pattern. The Cartesian sampling pattern may periodically skip one or more lines. The pattern may involve interleaving of lines in sequential images. In other examples, the sampling pattern of the k-space scan data includes a radial sampling pattern, such as a spiral or projection pattern.

In an act 406, a respective coil sensitivity profile is determined for the scanned region for each coil. The sensitivity profiles may be estimated through various techniques. In some cases, the coil sensitivities are determined through an iterative process in an act 408. In other cases, an SVD-based eigenvector technique is used in an act 410 to estimate the sensitivities. In still other cases, the sum of the squares method is used in an act 412. Any one or more of these and other techniques may be used.

The coil sensitivities may be estimated or determined based on reference scan data or on the scan data to be used for image reconstruction. In the latter case, the method may include an act 414 in which further k-space scan data is obtained for the region to be imaged. The scan data is undersampled to support image reconstruction as described herein. The act 414 may include conducting another scan in an act 416, such as a high quality scan. Alternatively, the scan data may be obtained by accessing the scan data stored from a previously conducted scan.

Once the coil sensitivity profiles are determined, an iterative reconstruction procedure is implemented in an act 418 to reconstruct dynamic images for the region from the k-space scan data. The iterative reconstruction procedure includes an optimization of a minimization problem, examples of which are described above. The minimization problem is based on the coil sensitivity profiles and redundant Haar wavelet transforms of the dynamic images, as described above. The minimization problem is configured to minimize an objective function having a data fidelity term. The data fidelity term may be configured in accordance with an L2 or other norm. The norm may be based on a Fourier transform of the undersampled dynamic images. The Fourier transform may be configured in accordance with the sampling pattern. The Fourier transform may be modified in accordance with an undersampling operator configured in accordance with a sampling pattern of the k-space scan data, as described above.

The objective function also includes a prior knowledge term representative of prior knowledge of the redundant Haar wavelet transforms being sparse. The redundant Haar wavelet transforms may be weighted to emphasize temporal correlations in the dynamic images.

One or both of the data fidelity and prior knowledge terms of the minimization problem may be weighted relative to one another. In some cases, one or more weighting factors are selected in an act 420. For example, the weighting factor, $\lambda$, in the above-described objective function may be selected.

During each iteration of the optimization, the data fidelity term may be calculated in an act 422. The data fidelity term is calculated based on the coil sensitivity profiles and the Fourier transform of the undersampled dynamic images. The Fourier transform may thus be configured in accordance with the sampling pattern used in obtaining the k-space scan data. The prior knowledge term is also calculated in an act 424 during each iteration of the optimization. The calculation of the prior knowledge term includes the determination of the Haar wavelet coefficients, which may be weighted to emphasize temporal correlations in the dynamic images.

Figure 5B:
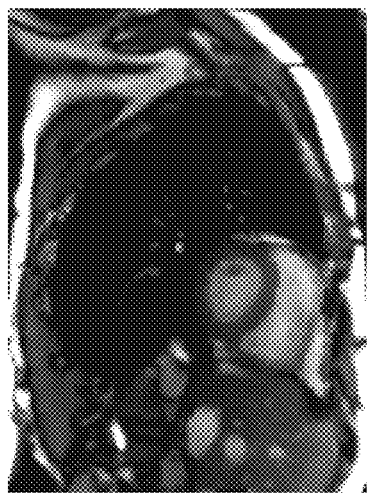
FIGS. 5A and 5B are examples of images reconstructed in accordance one embodiment of the disclosed methods and systems.
Figure 5A:
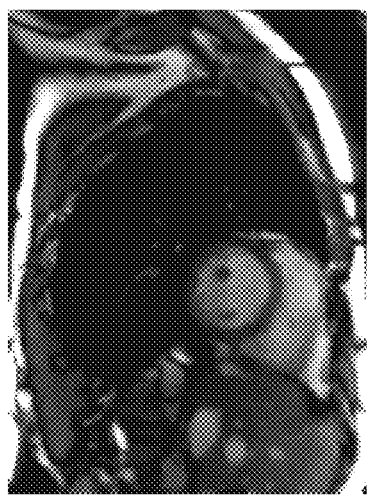

FIGS. 5A and 5B depicts an iterative reconstruction method to reconstruct cine cardiac images in accordance one embodiment. Scan data was acquired on 3.0 T MRI scanner (MAGNETOM Skyra System, Siemens Healthcare, Erlangen, Germany) with 30 coils. The following imaging parameters were used: FOV=340×255 mm$^2$; matrix=224×168; TR/TE=29/1.26 ms; bandwidth per pixel=1395 HZ; flip angle=38°; and, a temporal resolution=30 ms. For each temporal phase, scan data for 38 temporal phases and 10 frequency encodings was acquired.

FIGS. 5A and 5B depict the results of the reconstruction procedure for phases 1 and 19, respectively. The reconstructed cine cardiac images do not include the artifacts observed in the results presented by other reconstruction procedures, especially when the images are displayed in a video sequence. The spatial and temporal regularization provided by the reconstruction procedure of the disclosed embodiments generates artifact-free results.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. A method of image reconstruction for a magnetic resonance imaging (MRI) system comprising a plurality of coils, the method comprising:
   obtaining k-space scan data captured by the MRI system, the k-space scan data being representative of an undersampled region over time;
   determining, with a processor, a respective coil sensitivity profile for the region for each coil of the plurality of coils; and
   iteratively reconstructing, with the processor, dynamic images for the region from the k-space scan data via an optimization of a minimization problem;
   wherein the minimization problem is a function of the determined coil sensitivity profiles and redundant Haar wavelet transforms of the dynamic images.

2. The method of claim 1, wherein the redundant Haar wavelet transforms are weighted to emphasize temporal correlations in the dynamic images.

3. The method of claim 1, wherein a sampling pattern of the k-space scan data comprises a Cartesian sampling pattern.

4. The method of claim 3, wherein the Cartesian sampling pattern periodically skips one or more lines.

5. The method of claim 1, wherein a sampling pattern of the k-space scan data comprises a radial sampling pattern.

6. The method of claim 1, further comprising obtaining reference scan data, wherein the coil sensitivity profiles are determined based on the reference scan data.

7. The method of claim 1, wherein the minimization problem is further based on a Fourier transform of the dynamic images of the undersampled region.

8. The method of claim 7, wherein the Fourier transform is modified in accordance with an undersampling operator configured in accordance with a sampling pattern of the k-space scan data.

9. The method of claim 1, wherein determining the respective coil sensitivity profiles comprises estimating each coil sensitivity profile using a singular value decomposition (SVD)-based eigenvector technique.

10. The method of claim 1, wherein the minimization problem is configured to minimize an objective function comprising a data fidelity term configured in accordance with an L2 norm.

11. The method of claim 1, wherein the minimization problem is configured to minimize an objective function comprising a prior knowledge term representative of prior knowledge of the redundant Haar wavelet transforms being sparse.

12. A computer program product for implementing a method of image reconstruction for a magnetic resonance imaging (MRI) system comprising a plurality of coils, the computer program product comprising one or more non-transitory computer-readable storage media having stored thereon computer-executable instructions that, when executed by one or more processors of a computing system, cause the computing system to perform the method, the method comprising:
   obtaining k-space scan data captured by the MRI system, the k-space scan data being representative of an undersampled region over time;
   estimating a respective coil sensitivity profile for the undersampled region for each coil of the plurality of coils; and
   iteratively reconstructing dynamic images for the undersampled region from the k-space scan data via an optimization of a minimization problem;
   wherein the minimization problem comprises a first term based on a Fourier transform of the dynamic images of the undersampled region and the estimated coil sensitivity profiles and further comprises a second term comprising weighted redundant Haar wavelet transforms of the dynamic images.

13. The computer program product of claim 12, wherein the redundant Haar wavelet transforms are weighted to emphasize temporal correlations in the dynamic images.

14. The computer program product of claim 12, wherein the Fourier transform is modified in accordance with an undersampling operator configured in accordance with a sampling pattern of the k-space scan data.

15. The computer program product of claim 12, wherein the first term is configured in accordance with an L2 norm.

16. The computer program product of claim 12, wherein the second term is representative of prior knowledge of the redundant Haar wavelet transforms being sparse.

17. A data processing system for a magnetic resonance imaging (MRI) system comprising a plurality of coils, the data processing system comprising:
   a memory in which coil sensitivity estimation instructions and iterative reconstruction instructions are stored;
   a data store in which k-space scan data captured by the MRI system is stored, the k-space scan data being representative of an undersampled region over time; and
   a processor coupled to the memory and the data store, and configured to execute the coil sensitivity estimation instructions to estimate a respective coil sensitivity profile for the undersampled region for each coil of the plurality of coils;
   wherein the processor is further configured to execute the iterative reconstruction instructions to reconstruct dynamic images for the undersampled region from the k-space scan data via an optimization of a minimization problem;
   wherein the minimization problem comprises a first term based on a Fourier transform of the dynamic images of the undersampled region and the estimated coil sensitivity profiles and further comprises a second term comprising weighted redundant Haar wavelet transforms of the dynamic images.

18. The data processing system of claim 17, wherein the Fourier transform is modified in accordance with an undersampling operator configured in accordance with a sampling pattern of the k-space scan data.

19. The data processing system of claim 17, wherein the first term is configured in accordance with an L2 norm.

20. The data processing system of claim 17, wherein the second term is representative of prior knowledge of the redundant Haar wavelet transforms being sparse.

* * * * *